United States Patent [19]

Marzalek

[11] 4,130,808
[45] Dec. 19, 1978

[54] PHASE LOCK STABILIZED SWEPT FREQUENCY SIGNAL SOURCE

[75] Inventor: Michael S. Marzalek, Cotati, Calif.

[73] Assignee: Hewlett-Packard Company, Palo Alto, Calif.

[21] Appl. No.: 805,195

[22] Filed: Jun. 9, 1977

[51] Int. Cl.² .................. H03B 3/04; H03B 23/00
[52] U.S. Cl. .................................. 331/14; 331/4; 331/25; 331/178
[58] Field of Search .................. 331/4, 14, 18, 25, 178

[56] References Cited

U.S. PATENT DOCUMENTS

| 3,638,135 | 1/1972 | Stover | 331/178 X |
| 3,965,438 | 6/1976 | Winston | 331/178 X |

OTHER PUBLICATIONS

Keiter, "A Fully Calibrated, Solid State Microwave Spectrum Analyzer" Hewlett-Packard Journal, Sep. 1971, pp. 4–9.

*Primary Examiner*—Siegfried H. Grimm
*Attorney, Agent, or Firm*—Patrick J. Barrett

[57] ABSTRACT

A variable frequency oscillator is disclosed which is electronically and periodically swept from one frequency to another. Prior to the beginning of each sweep, the variable frequency oscillator is phase locked to a reference signal source and the error voltage in the phase lock loop is stored. When the sweep begins the phase lock loop is opened and the error voltage is summed with a sweep voltage to provide for correction of oscillator drift on a sweep by sweep basis.

5 Claims, 4 Drawing Figures

PHASE LOCK STABILIZED SWEPT FREQUENCY SIGNAL SOURCE

BACKGROUND OF THE INVENTION

Many electronic devices such as spectrum analyzers use swept frequency oscillators as local oscillators in order to repeatedly tune over a particular band of frequencies. One of the drawbacks of analog sweep oscillators is that they drift in frequency, and this lack of stability in the local oscillator is reflected in the lack of stability in the frequency readout of the spectrum analyzer. This problem has been solved in the past by using a local oscillator which is synthesized or digitally swept in discreet steps. This, however, has the disadvantage that it is much more expensive than an analog swept oscillator and the sweep has a number of steps in it rather than being one, smooth, continuous curve.

Other prior art spectrum analyzers have attempted to overcome the problem of instability in the first local oscillator by phase locking the first local oscillator to a fixed reference and then sweeping one of the lower frequency local oscillators over a narrower band. Since the lower frequency local oscillator has greater stability than the broad frequency range first local oscillator frequency instabilities are reduced. An example of this technique is shown in U.S. Pat. No. 3,482,181.

Another technique for stabilizing a swept frequency oscillator is shown in U.S. Pat. No. 3,144,623 in which the sweeping oscillator is injection locked at the start of the sweep and nulls are counted during the sweep for correction of the oscillator frequency. One of the disadvantages of this technique is that because no error voltage is stored there is a discontinuity at the start of the sweep until the loop corrects the oscillator. This closed loop sweeping technique uses a considerable amount of circuitry for linearity correction which, with some oscillators and for some applications, is unnecessary and thus unjustifiably expensive.

SUMMARY OF THE INVENTION

According to a preferred embodiment of the present invention an electronically tunable variable frequency oscillator is provided which can be phase locked to a reference frequency oscillator which is much more stable then the variable frequency oscillator. The outputs of both oscillators are connected to a phase detector whose output is fed through a sample and hold circuit and a summing amplifier back to the control input of the variable frequency oscillator. A sweep signal from a sweep generator is also supplied to the summing amplifier.

Before the beginning of each sweep, the sample and hold circuit is closed to establish phase lock between the reference frequency oscillator and the variable frequency oscillator, and the error signal from the phase detector is stored on a capacitor. Next, the sample and hold circuit is opened, opening the phase lock loop; and then the sweep signal begins to change value linearly sweeping the voltage controlled oscillator. Since the error voltage that was established at the beginning of the sweep is stored on the capacitor and is continuously summed with the sweep voltage, the voltage controlled oscillator is compensated for any frequency drifts that might have taken place before the sweep began. The only frequency drift that can affect the accuracy of the sweep oscillator output are those drifts that take place during the sweep itself.

At the end of the sweep, the sweep generator is reset, returning the voltage controlled oscillator to its original frequency, plus or minus the amount it has drifted during the sweep. Then the sample and hold circuit is again closed. Phase lock is once again established and the drift during the last sweep is compensated. At this point the sweep cycle begins once again.

This system allows for the correction of drifts in a first local oscillator in a spectrum analyzer without the expense of having a digitally swept oscillator or having to rely on narrower band oscillator or the complexity of closed loop sweeping.

DETAILED DESCRIPTION OF THE PREFERRED EMBODIMENT

Figure 1:
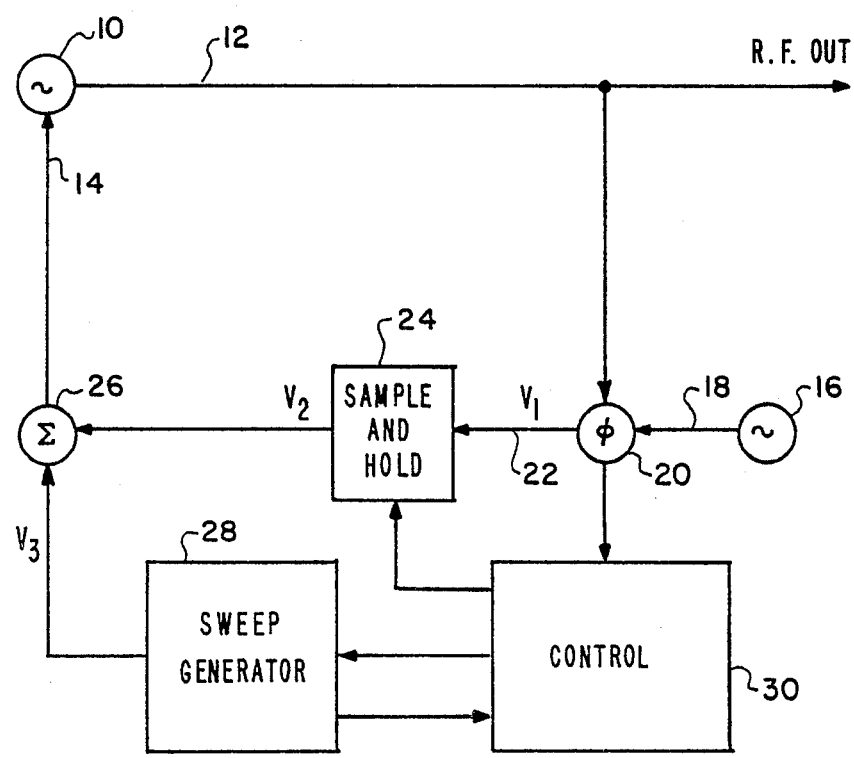
FIG. 1 shows a simplified block diagram of the preferred embodiment of the present invention.

FIG. 1 shows an electronically controlled variable frequency oscillator, such as a voltage controlled oscillator 10 having a signal output 12 and a control input 14. A reference oscillator 16 has a signal output 18 which is connected to a phase comparator 20. Reference oscillator 16 may be simply a fixed frequency, high stability oscillator such as a crystal oscillator or it may be a synthesized frequency source. Signal output 12 from voltage controlled oscillator 10 is also connected to phase comparator 20, and the phase difference between the output signals from the two oscillators appears on output 22. Output 22 is connected to a sample and hold circuit 24 which in turn is connected to a summing circuit 26. The output of summing circuit is connected to control input 14 of the voltage controlled oscillator.

A sweep generator 28 is connected to a second input of the summing circuit 26. A control circuit 30 is connected to sweep generator 28, sample and hold circuit 24 and phase comparator 20 to control the sweep generator and the sample and hold circuit.

Figure 2:
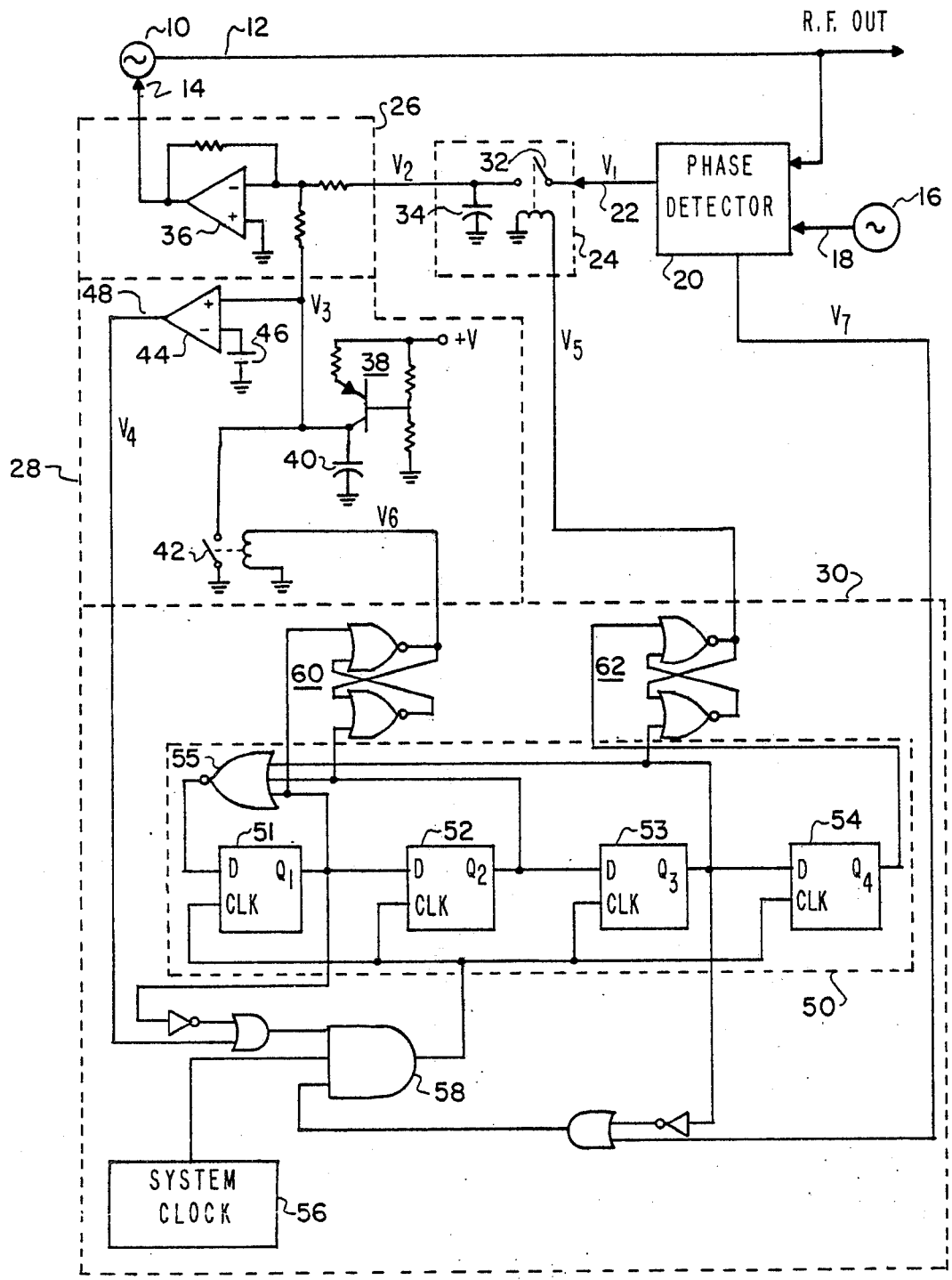
FIG. 2 shows a schematic diagram of the apparatus of FIG. 1.

Circuitry implementing the block diagram of FIG. 1 is shown in greater detail in FIG. 2. Here sample and hold circuit 24 is shown as having a relay 32 between the input and output thereof, with a capacitor 34 connected between ground and the output side of the circuit. When relay 32 is closed, capacitor 34 will store the value of the signal at the output of phase detector 20.

Summing circuit 26 comprises an operational amplifier 36 with appropriate input and feedback resistors connecting the amplifier to the output of sample and hold circuit 24 and sweep generator 28.

Sweep generator 28 includes a current source 38 feeding a capacitor 40 to create a linearly increasing ramp or sweep voltage. The capacitor is connected to a relay 42 which shorts the capacitor to ground when the relay is closed in order to reset the sweep. Also connected to the capacitor is a comparator 44 to compare the voltage on the capacitor with a reference voltage established by voltage source 46 for determining the end of the sweep and producing an end of sweep signal which appears on comparator output 48. Control circuit 30 comprises a four-bit shift register 50 having four "D" flip-flops 51 through 54. NOR gate 55 assures that only one of the D flip-flops has a "1" or high output at any given time. A system clock 56 provides periodic clock pulses to the shift register through AND gate 58 to drive the shift register.

Figure 3:
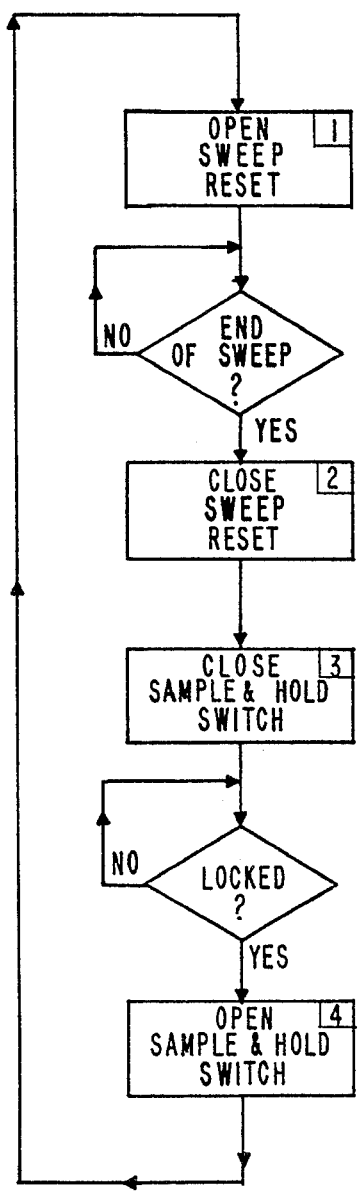
FIG. 3 shows a flow chart of the operation of the preferred embodiment.

The operation of control circuit 30 is illustrated in the flow diagram of FIG. 3. The four rectangles in the flow diagram represent the four states of shift register 50 and a separate function is performed in each of the states as represented by the labeling in the rectangles. Thus, a high output on flip-flop 51 corresponds to state 1, a high output on flip-flop 52 to state 2, etc. In state 1 the sweep reset switch, relay 42, is opened by applying a signal to the relay coil via flip-flop 60. At this point, current from current source 38 will be applied to capacitor 40 and the voltage on the capacitor will increase linearly producing a voltage ramp. This ramp is illustrated as signal $V_3$ in FIG. 4. At the end of the sweep an end-of-sweep signal $V_4$ will be produced by comparator 44 to cause the shift register to advance to the next state, 2, where the sweep reset switch is closed causing the sweep voltage $V_3$ to return to zero.

After the sweep voltage has returned to zero, the shift register will shift to state 3 and the sample and hold switch, relay 32 will be closed by flip-flop 62 with the application of signal $V_5$ to the coil of the relay.

Figure 4:
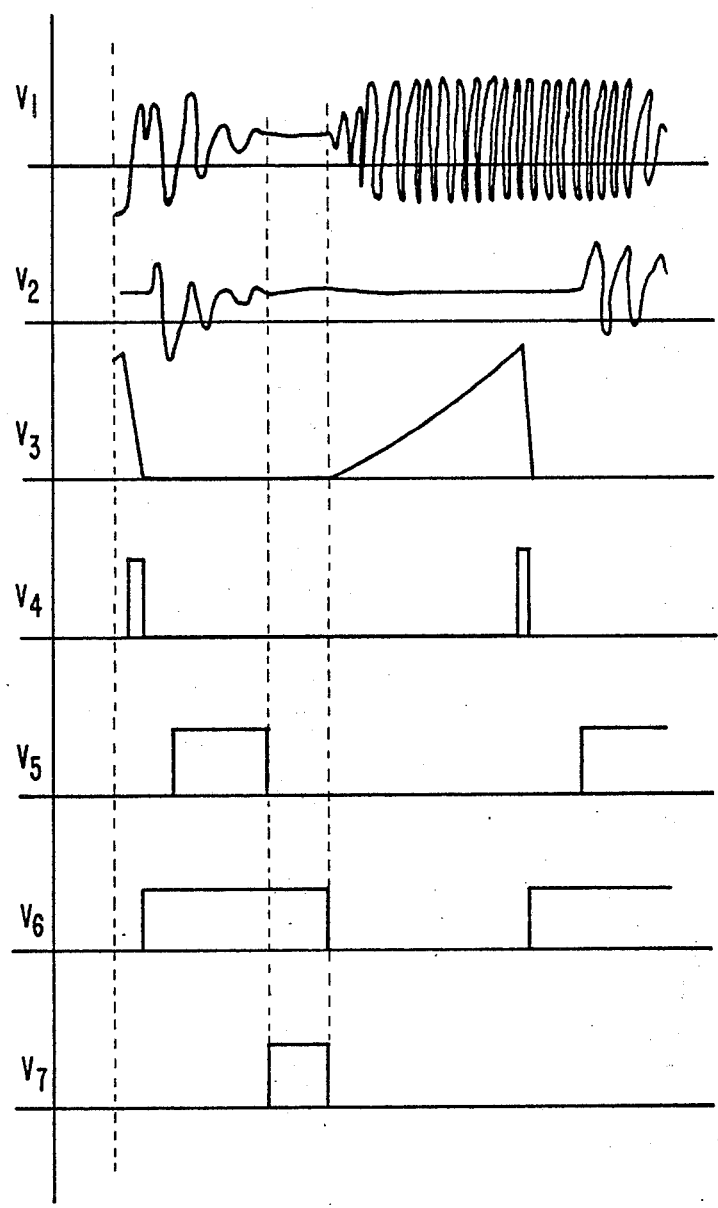
FIG. 4 shows a graph of several of the signals in the circuit of FIG. 2.

Since relay 32 has closed the phase lock loop around voltage controlled oscillator 10, the oscillator frequency will be phase locked to the frequency of reference oscillator 16. The error voltage, $V_1$, from the phase detector will become constant in value when this is accomplished, as illustrated in FIG. 4. In addition, the phase detector produces a "phase locked" signal, $V_7$, to indicate that lock has been accomplished. At this point, the shift register will advance to the next state, 4, and the sample and hold switch will be opened. The error signal, $V_1$, has been stored in capacitor 34 as signal $V_2$ and that value will remain constant during the sweep, as shown in FIG. 4. The shift register is now ready to return to state 1 where the sweep reset switch is opened and another sweep can be started.

Control circuit 30 has been illustrated as hardwired logic in the form of gates and flip-flops. However, it will be understood by those skilled in the art that the control function can also be executed in other ways such as, for example, by using a ROM programmed micro-processor which may be part of an overall system control circuit.

I claim:
1. A swept frequency signal source comprising:
   a reference frequency signal source;
   a variable frequency signal source having a signal output and a control input;
   phase lock means connected to the reference frequency and variable frequency signal sources for producing a control signal for the variable frequency signal source and establishing phase lock between the variable frequency signal source and the reference frequency signal source;
   sweep generator means coupled to the variable frequency signal source for producing a periodic sweep signal having a time varying and a constant portion; and
   control means connected to the phase lock means and the sweep generator means for causing the phase lock means to phase lock the input signal of the variable frequency signal source to the output signal of the reference frequency signal source during the constant portion of each sweep signal and, in response to the establishment of said phase lock, for opening the phase lock, storing the control signal and adding the control signal to the sweep signal during the time varying portion of each sweep signal to sweep the frequency of the output signal from the variable frequency signal source starting from a frequency established in accordance with the control signal.

2. A swept frequency signal source as in claim 1 wherein the phase lock means comprises:
   a phase comparator having inputs connected to the reference signal source and to the signal output of the variable frequency signal source and having an error signal output;
   a sample and hold circuit having a signal input connected to the error signal output of the phase comparator, a control input connected to the control means and an output; and
   a summing circuit having inputs connected to the sample and hold circuit output and to the sweep generator means and an output connected to the variable frequency signal source control input.

3. A swept frequency signal source as in claim 2 wherein the sweep generator means comprises:
   a ramp generating circuit having an output coupled to the summing circuit;
   a reset circuit connected to the output of the ramp generating circuit and having a control input connected to the control means; and
   an end-of-sweep circuit connected to the output of the ramp generating circuit and having an output connected to the control means.

4. A swept frequency signal source as in claim 3 wherein the phase detector has a status signal output connected to the control means to indicate that the variable frequency signal source is phase locked to the reference frequency signal source.

5. A method for producing a swept frequency signal comprising the steps of:
   providing a variable frequency signal source;
   providing a reference frequency signal source;
   phase locking the variable frequency signal source to the reference frequency signal source while the variable frequency signal source frequency is not being swept, thereby producing a phase lock error signal for controlling the variable frequency signal source and producing a phase lock status signal;
   storing the phase lock error signal;
   opening the phase lock between the variable frequency signal source and the reference frequency signal source in response to the phase lock status signal while continuing to supply the stored error signal to the variable frequency signal source;
   adding a sweep signal to the error signal to sweep the frequency of the variable signal source; and
   resetting the sweep signal to a predetermined value and holding the sweep signal at the predetermined value while re-establishing phase lock.

* * * * *

UNITED STATES PATENT AND TRADEMARK OFFICE
CERTIFICATE OF CORRECTION

PATENT NO. : 4,130,808
DATED : December 19, 1978
INVENTOR(S) : Michael S. Marzalek It is certified that error appears in the above-identified patent and that said Letters Patent are hereby corrected as shown below:

Column 1, line 46, "then" should read -- than --;

Column 2, line 11, "oscillator" should read -- oscillators --;

Column 4, line 1, "input" should read -- output --.

Signed and Sealed this

Eighth Day of May 1979

[SEAL]

Attest:

RUTH C. MASON
Attesting Officer

DONALD W. BANNER
Commissioner of Patents and Trademarks